(12) United States Patent
Stephani et al.

(10) Patent No.: US 8,773,942 B2
(45) Date of Patent: Jul. 8, 2014

(54) SEGMENTED MEMORY HAVING POWER-SAVING MODE

(71) Applicant: LSI Corporation, Milpitas, CA (US)

(72) Inventors: Richard J. Stephani, Saint Paul, MN (US); Gordon W. Priebe, Champlin, MN (US); Ankur Goel, Haryana (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/664,772

(22) Filed: Oct. 31, 2012

(65) Prior Publication Data
US 2014/0119147 A1    May 1, 2014

(51) Int. Cl.
*G11C 8/00* (2006.01)
*G11C 8/08* (2006.01)
*G11C 8/10* (2006.01)

(52) U.S. Cl.
CPC ... *G11C 8/08* (2013.01); *G11C 8/10* (2013.01)
USPC .................................. 365/230.06; 365/230.03

(58) Field of Classification Search
USPC .................. 365/226–229, 230.03, 230.06
See application file for complete search history.

(56) References Cited

U.S. PATENT DOCUMENTS

| 6,862,247 B2 * | 3/2005 | Yamazaki ................ 365/230.03 |
| 7,518,942 B2 * | 4/2009 | Sunaga .................... 365/230.06 |
| 7,760,569 B2 * | 7/2010 | Ruf et al. ..................... 365/211 |

* cited by examiner

*Primary Examiner* — Kretelia Graham
(74) *Attorney, Agent, or Firm* — Mendelsohn, Drucker & Dunleavy, P.C.; Steve Mendelsohn

(57) ABSTRACT

A memory array is divided into multiple segments, each segment having one or more rows of bitcells. Each segment has control circuitry that controls whether the segment is in an active mode or a power-saving, sleep mode. The control circuitry ensures that a segment transitions from sleep mode to active mode before a row of the segment is accessed by driving a corresponding wordline high. The control circuitry also ensures that, at the end of a row access, the wordline is driven low before the corresponding segment is transitioned from active mode to sleep mode.

11 Claims, 3 Drawing Sheets

200

SEGMENTED MEMORY HAVING POWER-SAVING MODE

BACKGROUND

This section introduces aspects that may help facilitate a better understanding of embodiments of the invention. Accordingly, the statements of this section are to be read in this light and are not to be understood as admissions about what is prior art or what is not prior art.

When a memory device having an array of SRAM (static random-access memory) bitcells is to be accessed (e.g., data written to or read from one or more rows of bitcells in the array), the entire array of bitcells in the memory device is configured in a so-called active mode with (i) the power supply voltage VDD applied to the drain nodes of certain p-type MOS (metal-oxide semiconductor) transistors in each bitcell in the array and (ii) a lower, ground voltage VSS applied to the source nodes VSSC of certain n-type MOS transistors in each bitcell in the array to enable the transistors to be turned on and off with appropriate control voltages applied to their gates.

In order to reduce power consumption due to leakage currents through the bitcells when access to such a memory device is not needed, it is known to bias the source nodes VSSC of such bitcells to an appropriate intermediate, data-retention voltage level between the ground voltage VSS and the power supply voltage VDD to place the memory device into a sleep mode in which the memory array cannot be accessed, but will retain data previously stored therein. Bias circuitry is provided to control the application and removal of such source bias voltages to enable the memory device to be selectively configured in either its sleep mode or its active mode.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

Figure 1:
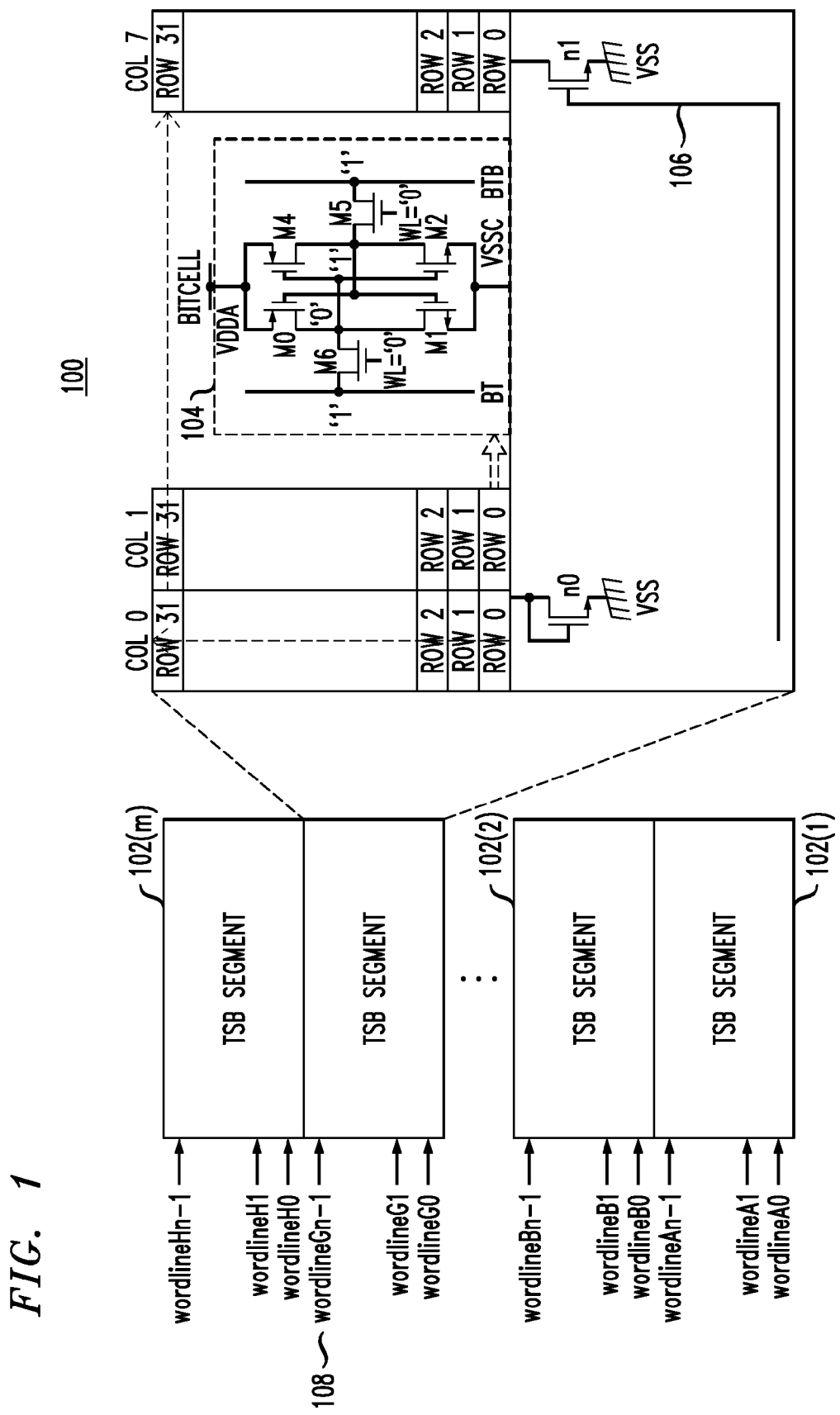
FIG. 1 shows a block diagram of a memory array for a memory device according to one embodiment of the disclosure.

FIG. 1 shows a block diagram of a memory array 100 for a memory device according to one embodiment of the disclosure. Memory array 100 comprises a plurality of bitcells 104 arranged in rows and columns. As indicated in FIG. 1, memory array 100 is configured to have a plurality of segments 102, each segment 102(i) having one or more rows, each row having one or more bitcells 104. While memory array 100 has been illustrated with segments having thirty-two rows and eight columns, embodiments of the invention are not limited thereto.

Configured to each segment 102(i) is bias circuitry comprising two n-type bias transistors n0 and n1, which can be used to configure the bitcells of that segment into either (i) an active mode in which the bitcells of the segment can be accessed or (ii) a source-biased, sleep mode that reduces the leakage current flowing through the bitcells. Memory array 100 has a different pair of bias transistors n0 and n1 for each different segment 102(i).

For each segment 102(i), when the corresponding bias transistor n1 is turned on (i.e., by a sufficiently high voltage level of enable-segment signal 106 applied to the gate of transistor n1), the segment's transistor source nodes VSSC are driven towards the ground voltage VSS, and the segment is configured into the active mode, such that the segment's bitcells can be accessed.

On the other hand, when bias transistor n1 is turned off (i.e., by a sufficiently low voltage level of enable-segment signal 106 applied to the gate of transistor n1), the bitcells of the segment are source-biased into the sleep mode by diode-connected bias transistor n0, such that data previously stored in the bitcells will be retained by the bitcells, but the bitcells cannot be accessed. During the sleep mode when bias transistor n1 is off, diode-connected bias transistor n0 keeps the source node voltage VSSC applied to the bitcells from getting too far from the ground voltage VSS to ensure that the bitcells retain their previously stored data.

When a segment is configured in the active mode, a row of bitcells is accessed by a wordline driver (not shown) driving a wordline signal 108 having a high voltage level onto a wordline associated with that row of bitcells. To operate properly, when a particular row of bitcells is accessed, it is important for the corresponding segment to be configured into its active mode prior to the wordline for that row being driven high. As such, the enable-segment signal 106 for that segment should be driven high prior to the wordline signal 108 for that row being driven high. Similarly, when row access is completed, it is important for the wordline to be driven low prior to the segment being configured into its sleep mode. As such, the wordline signal 108 should be driven low prior to the enable-segment signal 106 being driven low.

Note that, with the segmentation scheme of memory array 100, when a row of bitcells 104 in a particular segment 102(i) is to be accessed, only that segment 102(i) needs to be configured in the active mode. The other segments can remain in the sleep mode. If the next row to be accessed is in the same segment 102(i), then that segment can remain in the active mode with all of the other segments remaining in the sleep mode. If, instead, the next row to be accessed is in a different segment 102(j), then segment 102(j) is configured into the active mode, and segment 102(i) can be configured into the sleep mode along with all of the other segments.

Figure 2:
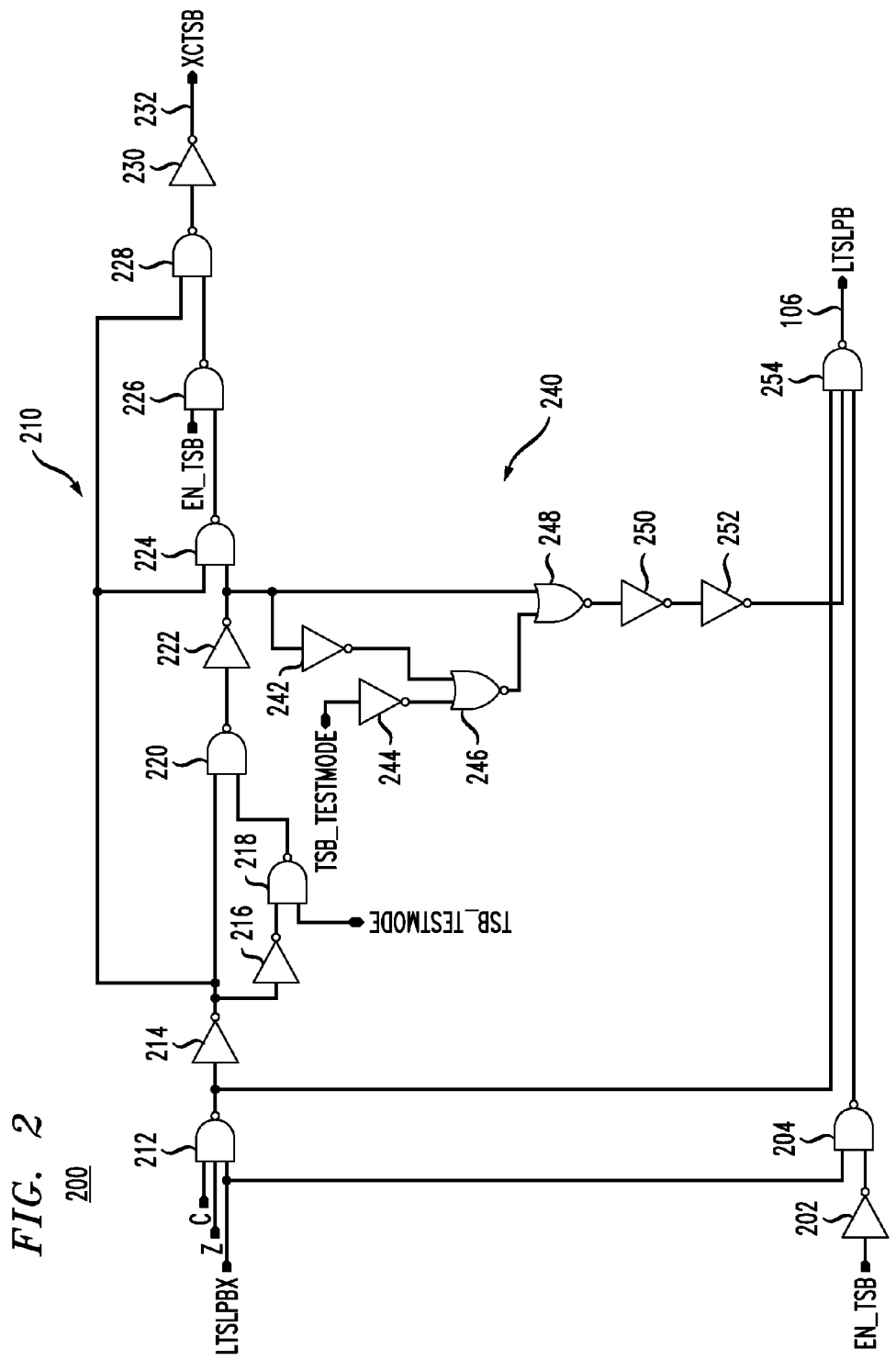
FIG. 2 shows a schematic circuit diagram of control circuitry designed to control the timing of an enable-segment signal and an enable-wordline signal to ensure proper operation of the memory array of FIG. 1.

FIG. 2 shows a schematic circuit diagram of control circuitry 200 designed to control the timing of an enable-segment signal 106 and an enable-wordline signal 232 to ensure proper operation of memory array 100 of FIG. 1. For each different segment 102(i), memory array 100 has a different instance of control circuitry 200 that generates a different instance of enable-segment signal 106 and a different instance of enable-wordline signal 232 for that segment.

The enable-segment signal 106 of FIG. 2 is the same as the enable-segment signal of FIG. 1. Although not shown in the figures, for a given segment 102(i), the enable-wordline signal 232 of FIG. 2 is independently gated with each different normal wordline signal to generate a different wordline signal 108 of FIG. 1 for each row of bitcells 104 in the segment. When enable-wordline signal 232 is high, then one wordline signal 108 at a time is able to be driven high to access to the corresponding row of bitcells in segment 102(i). When enable-wordline signal 232 is low, then all of the wordline signals 108 of that segment 102(i) will be low, thereby preventing access of those corresponding rows.

While control circuitry 200 is a single circuit that generates both the enable-segment signal 106 and the enable-wordline signal 232, alternative embodiments may have two or more different circuits that generate those signals from the same set of inputs.

Under normal operations, control circuitry 200 generates enable-segment signal 106 and enable-wordline signal 232 based on four one-bit input signals LTSLPBX, EN_TSB, C, and Z. There is also a special test-mode input signal TSB_TESTMODE that will be described later.

The signal TLSLPBX controls whether or not all of memory array 100 is configured in the sleep mode. The signal EN_TSB determines whether control circuitry 200 for a given segment 102($i$) is enabled or disabled. The signals C and Z are partially decoded row address bits that indicate whether or not the segment 102($i$) is to be accessed. In one implementation, the same value of the signal TLSLPBX and the same value of the signal EN_TSB are applied to each segment 102($i$) in memory array 100, while different segments 102 can receive different values for the signals C and Z.

Table I presents a logic table for control circuitry 200 for a segment 102($i$) in memory array 100, where X means "don't care." When signal LTSLPBX is low (logic 0) (i.e., Row A of Table I), then all segments 102 in memory array 100 are in sleep mode. As such, for each segment 102($i$), enable-segment signal 106 is low (such that bias transistor n1 is off and segment 102($i$) is in sleep mode) and enable-wordline signal 232 is also low (such that no row in segment 102($i$) can be accessed). When signal LTSLPBX is high (logic 1) (i.e., Rows B-I of Table I), then each segment 102($i$) will be in either active mode or sleep mode depending on the values of the other three inputs EN_TSB, C, and Z.

When the signal LTSLPBX is high and the signal EN_TSB is low (i.e., Rows B-E of Table I), then all segments 102 in memory array 100 are in active mode, and the values of the signals C and Z determine whether a row in segment 102($i$) is accessed. As such, whenever the signal EN_TSB is low, then enable-segment signal 106 is high (such that bias transistor n1 is on, and segment 102($i$) is in active mode). In that case, a row in segment 102($i$) is being accessed only when both signals C and Z are high (i.e., Row E of Table I); otherwise, no rows in segment 102($i$) are being accessed (i.e., Rows B-D of Table I).

When the signals LTSLPBX and EN_TSB are both high, then all of the segments 102 in memory array 100 are in sleep mode, except if the signals C and Z for a particular segment are both high, in which case, the segment is in active mode, and a row of that segment is being accessed. As such, as shown in Table I, if all four signals LTSLPBX, EN_TSB, C, and Z are high (i.e., Row I of Table I), then segment 102($i$) is in active mode, and a row of that segment is being accessed. Otherwise, if the signals LTSLPBX and EN_TSB are both high, but the signals C and Z are not both high (i.e., Rows F-H of Table I), then segment 102($i$) is in sleep mode, and none of the rows in that segment are being accessed.

Under normal operating conditions, the signals LTSLPBX and EN_TSB are static, and the dynamic operations of each segment 102($i$) are controlled by the corresponding values of the signals C and Z. There are two different normal operating modes for memory array 100: (1) an all-active mode, in which all of the segments 102 are always active, and (2) power-saving mode, in which at most one segment 102 is active, and the rest of the segments are asleep. For the all-active mode, (i) the signal LTSLPBX is high and (ii) the signal EN_TSB is low, where a row of at most one segment at a time will be accessed when the corresponding signals C and Z for that segment are both high. For the power-saving mode, the signals LTSLPBX and EN_TSB are both high, where a row will be accessed for at most one segment at a time for which the corresponding signals C and Z are both high.

For the power-saving mode, if two consecutively accessed rows are in the same segment 102($i$), then the corresponding signals C and Z will not change from accessing the first row to accessing the second row, and that segment will remain active with the remaining segments remaining asleep. If, however, two consecutively accessed rows are in different segments 102($i$) and 102($j$) during the power-saving mode, then the transition from accessing the first row to accessing the second row will involve (i) the corresponding signals C and Z for the first segment 102($i$) changing from both high to at least one low, thereby causing that first segment to go from active mode to sleep mode and (ii) the corresponding signals C and Z for the second segment 102($j$) changing from at least one low to both high, thereby causing that second segment to go from sleep mode to active mode. In an alternative implementation, all signals C and Z return to low at the end of the access cycle, in order to turn off the wordlines and allow the bitlines to precharge.

As described above, when accessing a row of a segment, it is important for the segment to become active before a wordline of that segment is allowed to be driven high. Similarly, when row access is complete, it is important for the corresponding wordline to be driven low before the corresponding segment goes to sleep. Control circuitry 200 of FIG. 2 is designed to achieve these two goals.

In particular, when memory array 100 is in the power-saving mode (i.e., both signals LTSLPBX and EN_TSB high), if the corresponding signals C and Z go from at least one low to both high to access a row of a previously asleep segment 102($i$), then control circuitry 200 ensures that enable-segment signal 106 goes from low to high to transition the segment to active mode before enable-wordline signal 232 transitions from low to high. In addition, if the corre-

TABLE I

LOGIC TABLE FOR SEGMENT CONTROL CIRCUITRY

| | INPUTS | | | | OUTPUTS | | |
|---|---|---|---|---|---|---|---|
| | LTSLPBX | EN_TSB | C | Z | Enable Segment | Enable Wordline | MODE |
| A | 0 | X | X | X | 0 | 0 | Segment asleep; No rows accessed |
| B | 1 | 0 | 0 | 0 | 1 | 0 | Segment active; No rows accessed |
| C | 1 | 0 | 0 | 1 | 1 | 0 | Segment active; No rows accessed |
| D | 1 | 0 | 1 | 0 | 1 | 0 | Segment active; No rows accessed |
| E | 1 | 0 | 1 | 1 | 1 | 1 | Segment active; Row accessed |
| F | 1 | 1 | 0 | 0 | 0 | 0 | Segment asleep; No rows accessed |
| G | 1 | 1 | 0 | 1 | 0 | 0 | Segment asleep; No rows accessed |
| H | 1 | 1 | 1 | 0 | 0 | 0 | Segment asleep; No rows accessed |
| I | 1 | 1 | 1 | 1 | 1 | 1 | Segment active; Row accessed | sponding signals C and Z go from both high to at least one low at the end of a row access for segment 102(*i*), then control circuitry 200 ensures that enable-wordline signal 232 goes from high to low before enable-segment signal 106 transitions from high to low to transition the segment to sleep mode.

Figure 3:
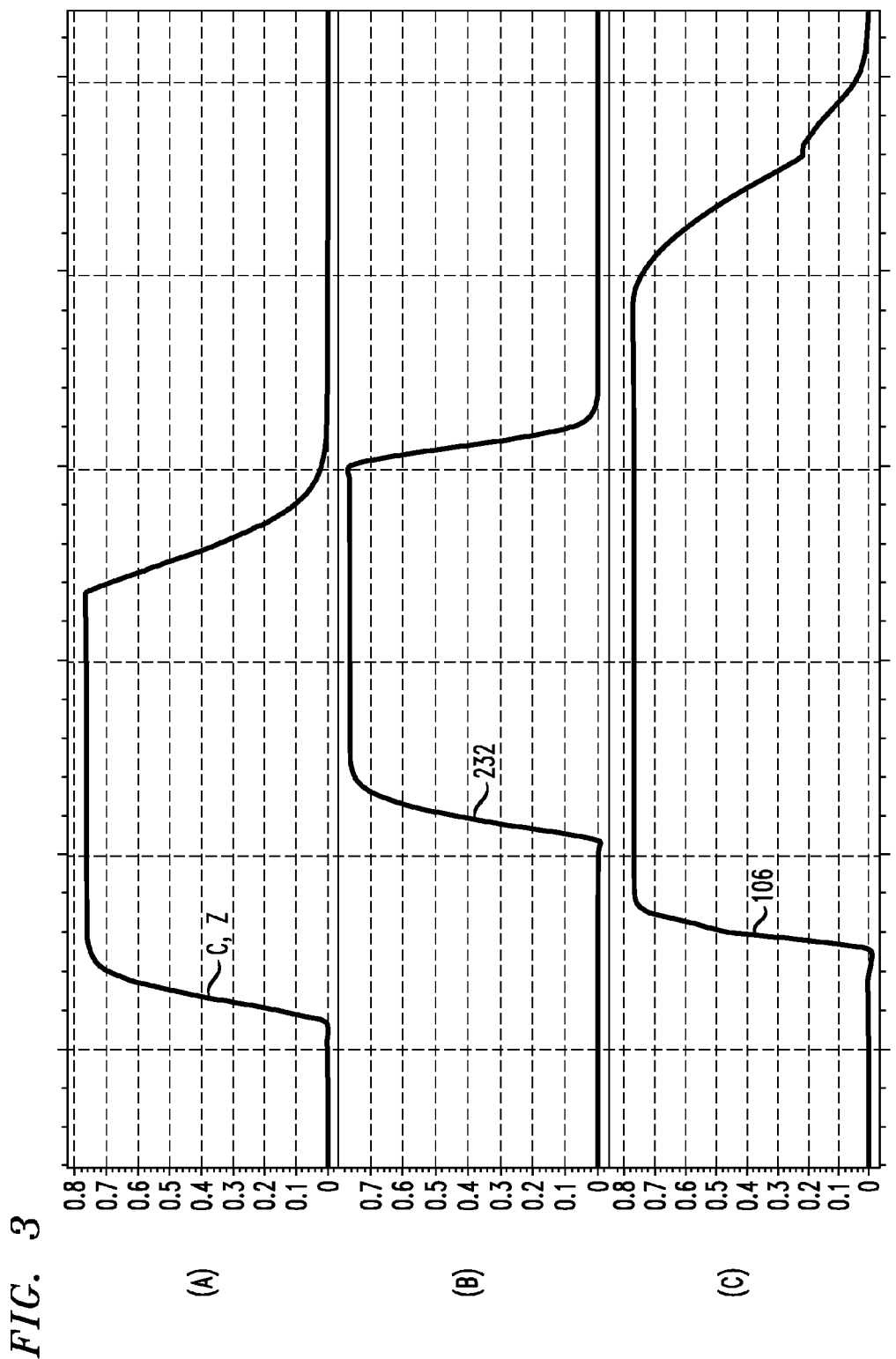
FIG. 3 shows timing diagrams of an exemplary power-saving mode situation for the memory array of FIG. 1.

FIG. 3 shows timing diagrams of an exemplary power-saving mode situation in which the signals C and Z transition from both low to both high (e.g., at the beginning of a row access) and then transition from both high to both low (e.g., at the end of that row access). As shown in FIG. 3(A), when the signals C and Z transition from both low to both high, enable-segment signal 106 of FIG. 3(C) goes high before enable-wordline signal 232 of FIG. 3(B) goes high. Similarly, when the signals C and Z transition from both high to both low, enable-wordline signal 232 of FIG. 3(B) goes low before enable-segment signal 106 of FIG. 3(C) goes low. Note that the timing diagrams for enable-segment signal 106 and enable-wordline signal 232 would be substantially identical for situations in which the signals C and Z transition from one high/one low to both high and from both high to one high/one low.

Referring again to FIG. 2, control circuitry 200 has two different signal paths 210 and 240 that function differently for rising edges and falling edges, where signal path 240 generates enable-segment signal 106, and signal path 210 generates enable-wordline signal 232. In particular, signal path 210 (consisting of elements 212-230) delays the rising edge of enable-wordline signal 232 longer than signal-delay path 240 (consisting of elements 212-222 and 242-254) delays the rising edge of enable-segment signal 106 to enable enable-segment signal 106 to transition from low to high before enable-wordline signal 232 transitions from low to high. In addition, signal-delay path 240 delays the falling edge of enable-segment signal 106 longer than signal-delay path 210 delays the falling edge of enable-wordline signal 232 to enable enable-wordline signal 232 to transition from high to low before enable-segment signal 106 transitions from high to low.

Note that, when memory array 100 is in the power-saving mode and two rows of the same segment 102(*i*) are to be consecutively accessed, the corresponding values of signals C and Z will remain both high, such that the corresponding enable-segment signal 106 and the corresponding enable-wordline signal 232 will both remain high from the beginning of the first row access through the end of the second row access. Whether they both remain high after the end of the second row access depends on whether or not the subsequent row to be accessed is in the same segment 102(*i*). In an alternative implementation, all signals C and Z return to low at the end of the access cycle, in order to turn off the wordlines and allow the bitlines to precharge.

Note further that, when memory array 100 is in the all-active mode, the enable-segment signal 106 remains high, while the enable-wordline signal 232 goes from low to high and from high to low as controlled by the corresponding signals C and Z. In this mode, there are therefore no timing issues.

The signal TSB_TESTMODE is used to modify the two critical timing relationships. When TSB_TESTMODE is high, it increases the delay between the enable-segment signal 106 going high and the enable-wordline signal 232 going high as compared to when TSB_TESTMODE is low. In addition, when TSB_TESTMODE is high, it increases the delay between the enable-wordline signal 232 going low and the enable-segment signal 106 going low as compared to when TSB_TESTMODE is low. TSB_TESTMODE is a static signal and would be set to high or low for all segments. The value would be set depending on the environment and need for increased margin on the critical timing relationships.

Although the disclosure has been described in the context of control circuitry 200 of FIG. 2, those skilled in the art will understand that there are many other suitable configurations of logic elements that will achieve the same goals as control circuitry 200 of (1) delaying low-to-high transitions of enable-wordline signals longer than low-to-high transitions of corresponding enable-segment signals and (2) delaying high-to-low transitions of enable-segment signals longer than high-to-low transitions of corresponding enable-wordline signals. For example, in control circuitry 200, the two signal paths 210 and 240 share six logic elements (i.e., elements 212-222). In alternative embodiments, the two signal paths might share more or fewer elements, including possibly sharing no elements.

Note that the disclosure has been described in the context of circuitry in which segments and wordlines are enabled by logic high signals. In alternative embodiments, one or both of segments and wordlines may be enabled by logic low signals. In such embodiments, the functions of rising and falling edges will be different, and the circuitry will be designed to delay those edges in appropriate relative ways.

Embodiments of the present invention may be implemented as (analog, digital, or a hybrid of both analog and digital) circuit-based processes, including possible implementation as a single integrated circuit (such as an ASIC, an FPGA, a stand-alone memory, or a processor with embedded memory), a multi-chip module, a single card, or a multi-card circuit pack. Embodiments of the present invention may also be implemented as part of any system requiring memory. As would be apparent to one skilled in the art, various functions of circuit elements may also be implemented as processing blocks in a software program. Such software may be employed in, for example, a digital signal processor, microcontroller, general-purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the present invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. Apparatus having a memory array comprising a plurality of segments, a segment comprising:
    one or more rows of memory cells, each row comprising two or more memory cells and a wordline interconnecting the memory cells of the row; and
    control circuitry configured to selectively enable and disable access to all of the segment and selectively enable and disable access to any individual row of the segment, wherein:
        the control circuitry is configured to generate (i) a segment-enable control signal that controls access to all of the segment and (ii) a segment-level wordline-enable control signal that controls whether a wordline signal can be applied to the wordline of a row to be accessed, wherein (a) the wordline-enable control signal is distinct from the wordline signal and (b) the control circuitry is configured to gate the wordline-enable control signal with each wordline signal in a segment to control whether any wordline signal can be applied to a corresponding wordline of a row in the segment, such that:
            when access to a row in the segment is to be initiated, the control circuitry generates the segment-enable control signal and the wordline-enable control signal to enables access to all of the segment before enabling access to the row and before the wordline signal can be applied to the wordline; and
            when access to the row in the segment is to be terminated, the control circuitry generates the segment-enable control signal and the wordline-enable control signal to disables access to the row and to disable the wordline signal from being applied to the wordline before disabling access to all of the segment.

2. The invention of claim 1, wherein the segment comprises bias circuitry configured to selectively bias the memory cells to enable or disable access to all of the segment.

3. The invention of claim 2, wherein the bias circuitry is further configured to ensure that the memory cells in the segment retain stored data when all of the segment is disabled for access.

4. The invention of claim 1, wherein:
    a first edge of the segment-enable control signal enables access to all of the segment;
    a second edge of the segment-enable control signal disables access to all of the segment;
    a first edge of the wordline-enable control signal enables the wordline signal to be applied to the wordline;
    a second edge of the wordline-enable control signal disables the wordline signal from being applied to the wordline; and
    the control circuitry is configured to:
    (i) delay the first edge of the wordline-enable control signal relative to the first edge of the segment-enable control signal; and
    (ii) delay the second edge of the segment-enable control signal relative to the second edge of the wordline-enable control signal.

5. The invention of claim 4, wherein the control circuitry comprises:
    a first signal path configured to generate the segment-enable control signal; and
    a second signal path configured to generate the wordline-enable control signal, wherein:
    (i) the first signal path delays the first edge of the wordline-enable control signal longer than the second signal path delays the first edge of the segment-enable control signal; and
    (ii) the second signal path delays the second edge of the segment-enable control signal longer than the first signal path delays the second edge of the wordline-enable control signal.

6. The invention of claim 1, wherein the control circuitry is configured to selectively enable access to one segment in the memory array while access is disabled to all other segments in the memory array.

7. The invention of claim 6, wherein the control circuitry is configured to selectively enable access to the one segment by configuring the one segment into an active mode, while access is disabled to the other segments by configuring the other segments into a sleep mode.

8. The invention of claim 1, wherein the apparatus is a memory device comprising the memory array.

9. The invention of claim 1, wherein the apparatus is an integrated circuit having a memory device comprising the memory array.

10. A memory comprising a plurality of segments, a segment comprising:
- a plurality of rows of memory cells, each row comprising at least one memory cell and a wordline interconnecting the memory cells of the row; and
- a control circuit configured to selectively enable and disable access to all of the segment, the control circuit selectively enabling access to all of the segment before enabling access to a row in the segment when access to the row in the segment is to be initiated, said control circuit also disabling access to the row before selectively disabling access to all of the segment when access to the row in the segment is to be terminated, wherein:
  - the control circuit is configured to generate (i) a segment-enable control signal that controls access to all of the segment and (ii) a segment-level wordline-enable control signal that controls whether a wordline signal can be applied to the wordline of a row to be accessed, wherein (a) the wordline-enable control signal is distinct from the wordline signal and (b) the control circuit is configured to gate the wordline-enable control signal with each wordline signal in a segment to control whether any wordline signal can be applied to a corresponding wordline of a row in the segment, such that:
    - when access to a row in the segment is to be initiated, the control circuit generates the segment-enable control signal and the wordline-enable control signal to enable access to all of the segment before enabling access to the row and before the wordline signal can be applied to the wordline; and
    - when access to the row in the segment is to be terminated, the control circuit generates the segment-enable control signal and the wordline-enable control signal to disable access to the row and to disable the wordline signal from being applied to the wordline before disabling access to all of the segment.

11. A method for operating a memory having a plurality of segments, each segment having a plurality of rows of memory cells, the method comprising:
(a) selectively (i) enabling access to all of a segment by generating a segment-enable control signal that controls access to all of the segment before (ii) enabling access to a row in the segment by generating a segment-level wordline-enable control signal that controls whether a wordline signal can be applied to the wordline of a row to be accessed, wherein (a) the wordline-enable control signal is distinct from the wordline signal and (b) the wordline-enable control signal gets gated with each wordline signal in a segment to control whether any wordline signal can be applied to a corresponding wordline of a row in the segment, when access to the row in the segment is to be initiated, and
(b) selectively (i) disabling access to the row by generating the wordline-enable control signal before (ii) disabling access to all of the segment by generating segment-enable control signal, when access to the row in the segment is to be terminated.

* * * * *